US008693761B2

(12) United States Patent
Haake et al.

(10) Patent No.: US 8,693,761 B2
(45) Date of Patent: Apr. 8, 2014

(54) METHOD OF GENERATING NUCLEAR MAGNETIC RESONANCE IMAGES USING SUSCEPTIBILITY WEIGHTED IMAGING AND SUSCEPTIBILITY MAPPING (SWIM)

(71) Applicant: Magnetic Resonance Innovations, Inc., Detroit, MI (US)

(72) Inventors: E. Mark Haake, Grosse Pointe Farms, MI (US); Jaladhar Neelavalli, Detroit, MI (US)

(73) Assignee: Magnetic Resonance Innovations, Inc., Detroit, MI (US)

( * ) Notice: Subject to any disclaimer, the term of this patent is extended or adjusted under 35 U.S.C. 154(b) by 0 days.

(21) Appl. No.: 13/800,118

(22) Filed: Mar. 13, 2013

(65) Prior Publication Data

US 2013/0195342 A1 Aug. 1, 2013

Related U.S. Application Data

(62) Division of application No. 12/768,456, filed on Apr. 27, 2010, now Pat. No. 8,422,756.

(51) Int. Cl.
*G06K 9/00* (2006.01)

(52) U.S. Cl.
USPC .......................................................... 382/131

(58) Field of Classification Search
CPC .................................................... G06T 11/003
See application file for complete search history.

(56) References Cited

U.S. PATENT DOCUMENTS

| 5,273,040 | A | 12/1993 | Apicella et al. |
|---|---|---|---|
| 5,337,000 | A | 8/1994 | Bruder |
| 5,408,178 | A | 4/1995 | Wikswo, Jr. et al. |
| 5,447,155 | A | 9/1995 | NessAiver et al. |
| 5,545,992 | A | 8/1996 | Foo |
| 5,644,646 | A | 7/1997 | Du et al. |
| 5,668,474 | A | 9/1997 | Heid |
| 5,742,163 | A | 4/1998 | Liu et al. |
| 5,952,827 | A | 9/1999 | Feinberg |
| 5,997,883 | A | 12/1999 | Epstein et al. |
| 6,034,528 | A | 3/2000 | Heid |
| 6,073,041 | A | 6/2000 | Hu et al. |
| 6,078,175 | A | 6/2000 | Foo |

(Continued)

FOREIGN PATENT DOCUMENTS

| WO | 03094696 A2 | 11/2003 |
|---|---|---|
| WO | 2009/134820 A2 | 11/2009 |

OTHER PUBLICATIONS

Susceptibility mapping in the human brain using threshold-based k-space division, Sam Wharton, Andreas Schafer, Richard Bowtell, Article first published online: Apr. 23, 2010, Magnetic Resonance in Medicine, vol. 63, Issue 5, pp. 1292-1304, May 2010.*

(Continued)

*Primary Examiner* — Michelle Entezari
(74) *Attorney, Agent, or Firm* — Thompson Coburn LLP (57) ABSTRACT

A method of generating a susceptibility map of an object utilizes a regularizing inverse function, oversampling k-space, removing external phase noise and rapid phase change effects, accounting for the known geometry of the object, and using modified SWI phase data to generate reasonable susceptibility maps and digital images therefrom, such as SWI images. The inventors refers to the inventive methods set forth herein as Susceptibility Weighted Imaging and Mapping (SWIM).

14 Claims, 6 Drawing Sheets

(56) References Cited

U.S. PATENT DOCUMENTS

| | | | |
|---|---|---|---|
| 6,192,264 | B1 | 2/2001 | Foo et al. |
| 6,246,897 | B1 | 6/2001 | Foo et al. |
| 6,381,351 | B1 | 4/2002 | Powell |
| 6,434,412 | B1 | 8/2002 | Simonetti et al. |
| 6,477,398 | B1 | 11/2002 | Mills |
| 6,501,272 | B1 | 12/2002 | Haacke et al. |
| 6,560,353 | B1 | 5/2003 | Haacke et al. |
| 6,658,280 | B1 | 12/2003 | Haacke |
| 6,841,998 | B1 | 1/2005 | Griswold |
| 6,920,346 | B2 | 7/2005 | Kazandjian et al. |
| 7,154,269 | B1 | 12/2006 | Haacke et al. |
| 7,324,842 | B2 | 1/2008 | Dale et al. |
| 7,440,093 | B1 | 10/2008 | Xiong et al. |
| 7,573,265 | B2 | 8/2009 | Haacke |
| 7,689,267 | B2 | 3/2010 | Prince |
| 7,692,424 | B2 | 4/2010 | Cheng et al. |
| 7,796,794 | B2 | 9/2010 | Beyrard |
| 8,170,315 | B2 * | 5/2012 | Mistretta et al. ............ 382/131 |
| 8,170,644 | B2 | 5/2012 | Du |
| 8,195,275 | B2 | 6/2012 | Zwick et al. |
| 8,472,688 | B2 * | 6/2013 | Samsonov et al. ........... 382/130 |
| 2006/0033492 | A1 * | 2/2006 | Van Den Brink ............ 324/307 |
| 2009/0102481 | A1 | 4/2009 | Haacke |
| 2009/0212773 | A1 * | 8/2009 | Feinberg et al. ............. 324/309 |
| 2009/0261824 | A1 | 10/2009 | Haacke et al. |
| 2010/0142785 | A1 | 6/2010 | Dahnke et al. |
| 2010/0264920 | A1 | 10/2010 | Witschey et al. |
| 2011/0044524 | A1 | 2/2011 | Wang et al. |

OTHER PUBLICATIONS

Andersen, "On the Rician Distribution of Noisy MRI Data", Magn Reson Med Letters to the Editor, 1996, pp. 331-333, vol. 36.

Bernstein et al., "Improved Detectability in Low Signal-to-Noise Ratio Magnetic Resonance Images by Means of a Phase-Corrected Real Reconstruction" Med Phys, Sep./Oct. 1989, pp. 813-817, vol. 16, No. 5.

Chang et al., "An Automatic Method for Estimating Noise-Induced Signal Variance in Magnitude-Reconstructed Magnetic Resonance images", SPIE Medical Imaging: Image Processing. 2005, pp. 1136-1142, vol. 5747.

Chen et al., "Noise Removal in Magnetic Resonance Diffusion Tensor imaging", Magnetic Resonance in Medicine, 2005, pp. 393-401, vol. 54.

Cheng et al., "Limitations of Calculating Field Distributions and Magnetic Susceptibilities in MRI Using a Fourier Based Method", Phys Med Biol, 2009, pp. 1169-1189, vol. 54.

Cline et al., "Volume Rendering and Connectivity Algorithms for MR Angiography", Magnetic Resonance in Medicine, 1991, pp. 384-394, vol. 18.

Constable et al., "Contrast, Resolution, and Detectability in MR imaging", Journal of Computer Assisted Tomography, 1991, pp. 297-303, vol. 15, No. 2.

De Rochefort et al., "Quantitative MR Susceptibility Mapping Using Piece-Wise Constant Regularized Inversion of the Magnetic Field", Magnetic Resonance in Medicine, 2008, pp. 1003-1009, vol. 60.

Deville et al., "NMR Multiple Echoes Observed in Solid 3He", Physical Review B, Jun. 1, 1979, pp. 5666-5688, vol. 19, No. 11.

Edelstein et al., "The Intrinsic Signal-to-Noise Ratio in NMR Imaging", Magnetic Resonance in Medicine, 1986, pp. 604-618, vol. 3.

Gudbjartsson et al., "The Rician Distribution of Noisy MRI Data", Magn Reson Med, 1995, pp. 910-914, vol. 34.

Haacke et al., "Imaging Iron Stores in the Brain Using Magnetic Resonance Imaging", Magnetic Resonance Imaging, 2005, pp. 1-25, vol. 23.

Haacke et al., "Susceptibility Weighted Imaging (SWI)", Magnetic Resonance in Medicine, 2004, pp. 612-618, vol. 52.

Hendrick et al., "Basic Physics of MR Contrast Agents and Maximization of Image Contrast", JMRI Jan./Feb. 1993, pp. 137-148, vol. 3.

Henkelman, "Measurement of Signal Intensities in the Presence of Noise in MR Images", Medical Physics, Mar./Apr. 1985, pp. 232-233, vol. 12, No. 2.

Jenkinson et al., "Perturbation Method for Magnetic Field Calculations of Nonconductive Objects", Magnetic Resonance in Medicine, 2004, pp. 471-477, vol. 52.

Kim et al., "Automatic Selection of Mask and Arterial Phase Images for Temporally Resolved MR Digital Subtraction Angiography", Magnetic Resonance in Medicine, 2002, pp. 1004-1010, vol. 48.

Koch et al., "Rapid Calculations of Susceptibility-Induced Magnetostatic Field Perturbations for In Vivo Magnetic Resonance", Phys Med Biol, 2006, pp. 6381-6402, vol. 51, No. 24.

Kressler et al., "Nonlinear Regularization for Per Voxel Estimation of Magnetic Susceptibility Distributions from MRI Field Maps", IEEE Trans Med Imaging, Feb. 2010, pp. 1-9.

Li et al., "Quantifying Arbitrary Magnetic Susceptibility Distributions with MR", Magnetic Resonance in Medicine, 2004, pp. 1077-1082, vol. 51.

Lin et al., "Automated Local Maximum-Intensity Projection with Three-Dimensional Vessel Tracking", JMRI, Sep./Oct. 1992, pp. 519-526, vol. 2.

Liu et al., "Calculation of Susceptibility Through Multiple Orientation Sampling (COSMOS): A Method for Conditioning the Inverse Problem From Measured Magnetic Field Map to Susceptibility Source Image in MRI", Magnetic Resonance in Medicine, 2009, pp. 196-204. vol. 61.

Lysaker et al., "Noise Removal Using Fourth-Order Partial Differential Equation with Applications to Medical Magnetic Resonance Images in Space and Time", IEEE Transactions on Image Processing, Dec. 2003, pp. 1579-1590, vol. 12, No. 12.

Macovski, "Noise in MRI", Magnetic Resonance Imaging, 1996, pp. 494-497, vol. 36.

Madore et al., "A New Way of Averaging with Applications to MRI", Med. Phys., Jan. 1996, pp. 109-113, vol. 23, No. 1.

Marques et al., "Application of a Fourier-Based Method for Rapid Calculation of Field inhomogeneity Due to Spatial Variation of Magnetic Susceptibility", Concepts in Magnetic Resonance Part B (Magnetic Resonance Engineering), 2005, pp. 65-78, vol. 25B(1).

Nowak, "Wavelet-Based Rician Noise Removal for Magnetic Resonance Imaging", IEEE Transactions on Image Processing, Oct. 1999, pp. 1408-1419, vol. 8, No. 10.

Reichenbach et al., "Small Vessels in the Human Brain: MR Venography with Deoxyhernoglobin as an Intrinsic Contrast Agent", Radiology, Jul. 1997, pp. 272-277, vol. 204, No. 1.

Rice, "Mathematical Analysis of Random Noise", Bell System Technical Journal, 1944, pp. 282-333.

Salomir et al., "A Fast Calculation Method for Magnetic Field Inhomogeneity Due to an Arbitrary Distribution of Bulk Susceptibility", Concepts in Magnetic Resonance Part B (Magnetic Resonance Engineering), 2003, pp. 26-34, vol. 198(1).

Sepulveda et al., "Magnetic Susceptibility Tomography for Three-Dimensional Imaging of Diamagnetic and Paramagnetic Objects", IEEE Trans. Magn., Nov. 1994, pp. 5062-5069, vol. 30, No. 6.

Shmueli et al., "Magnetic Susceptibility Mapping of Brain Tissue In Vivo Using MRI Phase Data", Magnetic Resonance in Medicine, 2009, pp. 1510-1522, vol. 62.

Sijbers et al., "Adaptive Anisotropic Noise Filtering for Magnitude MR Data", Magnetic Resonance Imaging, 1999, pp. 1533-1539, vol. 17, No. 10.

Sijbers et al., "Automatic Estimation of the Noise Variance From the Histogram of a Magnetic Resonance Image", Physics in Medicine and Biology, 2007, pp. 1335-1348, vol. 52.

Sijbers et al., "Estimation of the Noise in Magnitude MR Images", Magnetic Resonance Imaging, 1998, pp. 87-90, vol. 16, No. 1.

Wharton et al., "Susceptibility Mapping in the Human Brain Using Threshold-Based K-Space Division", Magnetic Resonance in Medicine, 2010, pp. 1292-1304, vol. 63.

* cited by examiner

Define $g_{Z,3D} = \frac{1}{4\pi} \frac{3\cos^2 \theta_{3D} - 1}{r^3}$ for 3D objects where $\theta$ is the 3D azhimuthal angle, r is the position vector, $r^2 = x^2+y^2+z^2$ in image domain for an image size of $aN_x$, $bN_y$ and $cN_z$.

Define $g_{Z,3D}(k) = FT[\ g_{Z,3D}(r)\ ]$

Define the inverse filter as $inv\_g_d(k) = 1/g_{Z,3D}(k)$

↓

Regularize $inv\_g_d(k)$ appropriately to remove large jumps in amplitude in $inv\_g_d(k)$ to obtain $g_{reg}(k)$

METHOD OF GENERATING NUCLEAR MAGNETIC RESONANCE IMAGES USING SUSCEPTIBILITY WEIGHTED IMAGING AND SUSCEPTIBILITY MAPPING (SWIM)

CROSS-REFERENCE TO RELATED APPLICATIONS

This application is a divisional of U.S. Ser. No. 12/768,456, filed Apr. 27, 2010, which is currently pending.

STATEMENT REGARDING FEDERALLY SPONSORED RESEARCH OR DEVELOPMENT

Not Applicable.

APPENDIX

Not Applicable.

BACKGROUND OF THE INVENTION

1. Field of the Invention

This invention relates generally to nuclear magnetic resonance imaging (commonly referred to as MRI). More specifically, this invention pertains to a method of creating a magnetic resonance susceptibility image of an object from it's MRI data using susceptibility weighted imaging and susceptibility mapping.

2. General Background Technology

Various magnetic resonance imagining techniques utilize susceptibility weighted imaging (SWI) to enhance the contrast between spatial discontinuities in the magnetic susceptibility within objects being scanned. SWI is described generally in U.S. Pat. No. 6,658,280, which is hereby and herein incorporated in its entirety by reference.

The ability to quantify local magnetic susceptibility is tantamount to being able to measure, the amount of iron in an object or body whether it is in the form of non-heme iron (such as ferritin or hemosiderin) or heme iron (de-oxyhemoglobin), or the amount of calcium or any other susceptibility affect causing materials including geometric effects. Recently, several methods of quantifying local magnetic susceptibility have been developed that utilize a fast Fourier transform approach. One of such methods utilizes the inverse of the Green's function.

$$g(k) = 1/3 - k_z^2/(k_x^2 + k_y^2 + k_z^2)$$

where $k_x$, $k_y$, and $k_z$ are the coordinates of the spatial-frequency domain of the phase data. That method, being derived from an ill-posed problem, is fraught with difficulties. The ill-posedness arises from zeros in the denominator of the analytic filter. To this end, various complicated and lengthy methods involving regularization, multiple scans acquired with the object being rotated between scans, and constrained least squares approaches have been practiced in an effort to improve results.

Whereas a least squares approach requires relatively accurate knowledge of the geometry of the object, methods using multiple orientation data require additional time for collecting data in different object orientations. The least squares approach in some cases also imposes a homogeneous-susceptibility constraint within an entire object. The direct inverse approach presented here overcomes these limitations as it primarily uses magnetic resonance phase information of the object from a single orientation and is a rapid and easily implemented technique.

Further, unlike SWI which has an orientation dependence on the phase behavior and hence in the end affects the final contrast, the present invention creates a data set that is independent of the object's orientation to the main magnetic field. Therefore, if one were to use the susceptibility data rather than the usual filtered phase data to create SWI data, the results will be superior in terms of not having an orientational dependence.

SUMMARY OF THE INVENTION

The present invention allows for the generation of superior quality magnetic source images or susceptibility maps (SM) of objects. Regularizing the inverse function, $g^{-1}(k)$, oversampling k-space, removing external phase noise and rapid phase change effects, and using SWI high pass filtered phase data, reasonable susceptibility maps can be generated from SWI data. The inventors refer to the inventive methods set forth herein as Susceptibility Weighted Imaging and Mapping (SWIM). The SWIM data can also be used to generate more robust SWI results, since the SWIM data is orientation independent.

In one aspect of the invention, a method of nuclear magnetic resonance imaging an object comprises a step of acquiring phase data, $\phi(r)$, from a gradient echo magnetic resonance scan of the object for a first matrix of $N_x$ by $N_y$ by $N_z$ data points, where $N_x$, $N_y$, and $N_z$ are each a positive integer (but necessarily the same integer). The method also includes generating $\phi(r)_{new}$ for a larger matrix of $aN_x$ by $bN_y$ by $cN_z$ data points, where aN, bN, and cN are each a positive integer (at least one which is greater than the corresponding value of first matrix). This is done using $\phi(r)$ and by assigning a constant to data points that are not common to both the first matrix and the larger matrix (many intermediate filtering steps could first be performed on $\phi(r)$, but $\phi(r)_{new}$ is nonetheless dependent upon $\phi(r)$). The method further comprises, Fourier transforming $\phi(r)_{new}$ and generating k-space data ($\phi(k)$)(corresponding to phase), therefrom. The method still further comprises multiplying $\phi(k)$ by a susceptibility mapping filter function and inverse Fourier transforming the product in a manner generating a susceptibility map estimate for the larger matrix. From all this, a digital image file of the object is created using the susceptibility map estimate. It should be appreciated that the term "using" is meant herein to be broad and means only that the digital image file is dependent in some manner on a step of generating this susceptibility map estimate. In other words, the digital image file may be dependent upon a more refined susceptibility map and/or other k-space or image data, but at some point the susceptibility map estimate is generated and ultimately plays a part in the generation of the digital image file.

In another aspect of the invention, a method of nuclear magnetic resonance imaging an object comprises acquiring phase data, $\phi(r)$, from a gradient echo magnetic resonance scan of the object and generating original k-space data ($\phi(k)$) (corresponding to phase) using $\phi(r)$. The method also comprises multiplying $\phi(k)$ by a regularized susceptibility mapping filter function and inverse Fourier transforming the product in a manner generating a susceptibility map estimate. Furthermore, the method comprises applying a threshold to the susceptibility map estimate and generating a revised susceptibility map estimate therefrom. Still further, the method comprises Fourier transforming the revised susceptibility map estimate and generating revised k-space data therefrom. Moreover, new k-space data is generated using both the original k-space data and the revised k-space data. From there, the new k-space data is inverse Fourier transformed to generate a modified susceptibility map estimate therefrom. Finally, a digital image file of the object is created using the modified susceptibility map estimate.

In yet another aspect of the invention, a method of nuclear magnetic resonance imaging an object comprises collecting k-space data from a gradient echo magnetic resonance scan of the object. The method also comprises generating initial phase and initial magnitude values using the k-space data, and generating a revised set of phase values using at least some of the initial magnitude values and at least some of the initial phase values. Still further, the method comprises generating local change in magnetic field values using at least some of the revised set of phase values, generating modified k-space data values (corresponding to phase) using at least some of the local change in magnetic field values, generating regularized modified k-space data values by applying a regularized inverse filter to the modified k-space data values, generating first susceptibility values using the regularized modified k-space data values, and generating second susceptibility values by applying a threshold to the first susceptibility values and/or by replacing the susceptibility values by a set of predetermined values. From there, third k-space data values are generated using the first susceptibility values, fourth k-space data values are generated using the second susceptibility values, and the third k-space data values and the fourth k-space data values are merged in a manner generating a fifth k-space data values. Finally, third susceptibility values are generated using the fifth k-space data values, and a digital image file of the object is generated using the third susceptibility values.

Still further, another method in accordance with the invention pertains to a method of nuclear magnetic resonance imaging an object that comprises acquiring phase data, $\phi(r)$, from a gradient echo magnetic resonance scan of the object. The method also comprises, replacing values in a subset of voxels of $\phi(r)$ with constant values based upon the geometry of at least a portion of the object. Still further, the method comprises generating original k-space data (corresponding to phase), herein referred to as $\phi(k)$, using $\phi(r)$ and multiplying $\phi(k)$ by a regularized susceptibility mapping filter function and inverse Fourier transforming the product in a manner generating a susceptibility map estimate. A digital image file of the object can then be generated using the modified susceptibility map estimate.

Further features and advantages of the present invention, as well as the operation of various embodiments of the present invention, are described in detail below with reference to the accompanying drawing figures.

DETAILED DESCRIPTION OF THE INVENTION

A detailed flowchart of the preferred method of practicing the present invention is set forth in FIGS. 1-6. This method can be performed on newly acquired nuclear magnetic resonance data or existing data to generate an image of an object that is based, at least in part, on the differences in magnetic susceptibility throughout the image and can be performed in two or three dimensions.

The method begins by obtaining phase image data (a data matrix) in a given size (i.e., of given numbers of data points in each dimension). That phase data is masked and filtered. This filtered and mask phase data is then used to partially fill a larger matrix. The phase data of the larger matrix is then Fourier transformed to yield modified k-space data. These steps are shown in Steps i-vii of FIG. 1. A regularized susceptibility mapping filter function (also referred to as regularized Inverse Green's Function) is also calculated (Steps viii and ix) for the larger matrix. These two processes can be performed simultaneously or in either order and are described immediately below in greater detail. It should also be appreciated that the regularized susceptibility mapping filter function could be replaced by an un-regularized or discrete version of it or an ideal filter as shown by subsections (A) and (E) in step x.

Figure 1:
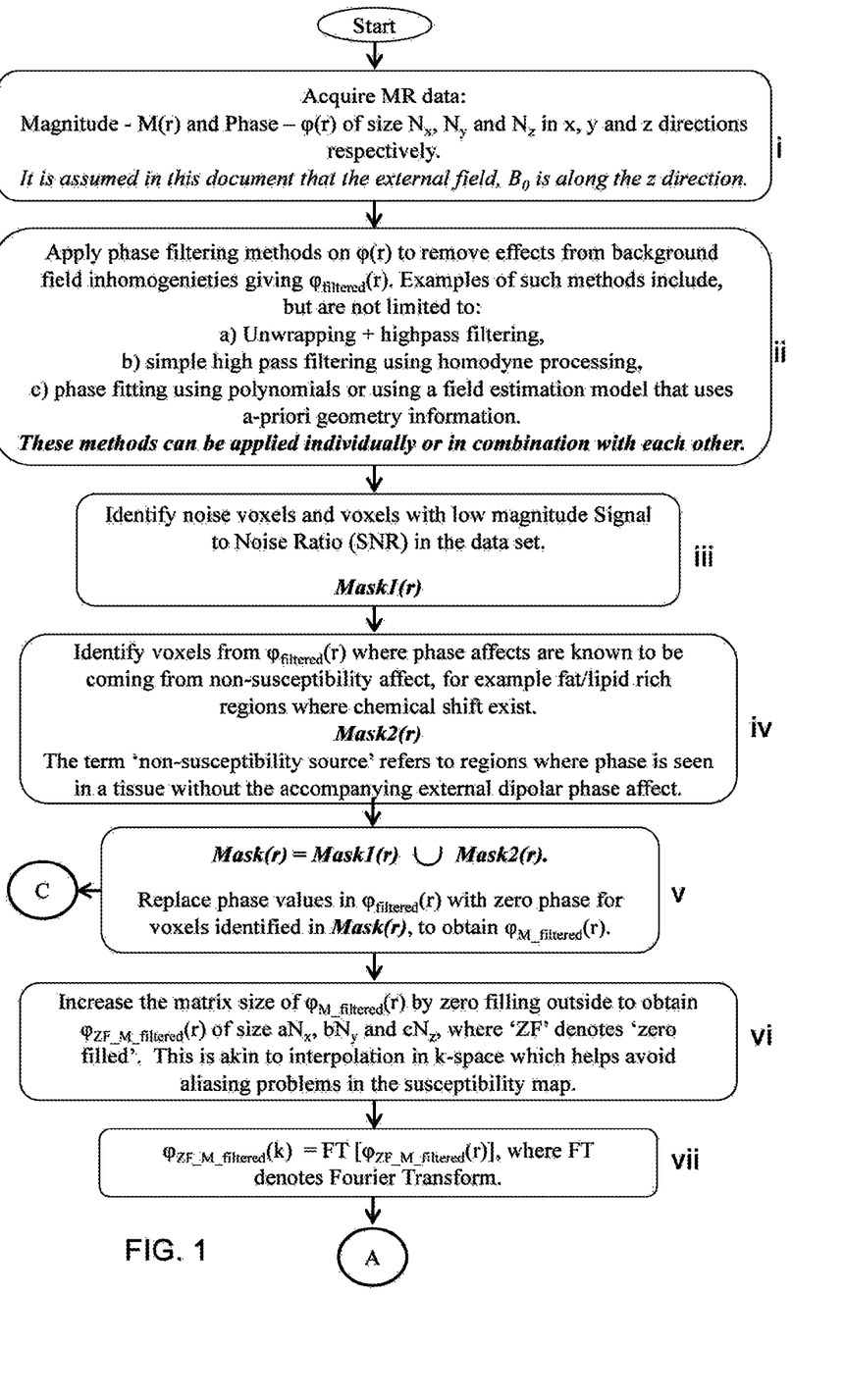
FIGS. 1-6 depict flowcharts of the steps of the preferred embodiment of the invention.

The generating of the modified k-space data using the filtered phase for the larger matrix involves several steps shown in FIG. 1. First, original magnitude and phase image data values are obtained from either a new MR scan of an object or previously collected MR scan data for a matrix of size $N_x$, $N_y$, $N_z$ in the x, y, and z directions respectively (where $N_x$, $N_y$, and $N_z$ are positive integers) (Step i). As shown in Step ii, a filter is then applied to the phase image data to remove effects from background field inhomogeneities. Various filters, such as unwrapping and highpass filtering, simple highpass filtering using homodyne processing, and phase fitting using polynomials or using a field estimation model based on a-priori geometry information, can be applied for this purpose and can be applied individually or in combination. This alters the phase image data values of some of the voxels in the phase image thereby creating a new set of phase image data values, $\phi_{filtered}(r)$, for the original matrix of voxels. Several masks can be applied to further refine the phase image data values of the original matrix, as shown in Steps iii-v. For example, as shown in Step iii, voxels of the original matrix having low magnitude data values in comparison to the overall noise (i.e., low magnitude Signal-to-Noise Ratio or simply SNR) can be identified. One such technique for identifying and reducing noise is described in U.S. Pat. No. 7,573,265, titled "Complex threshold method for reducing noise in nuclear magnetic resonance images," which is herein and hereby incorporated by reference in its entirety. Additionally, as shown in Step iv, voxels where phase effects are known to be caused by something other than susceptibility can be identified. These masks can then be merged or applied separately to the phase image by replacing the phase data values of the voxels identified with zeros (or some other constant value determined by the shape and orientation of the object). Still further, as shown in Step vi, the matrix size is increased in size to $aN_x$, $bN_y$, and $cN_z$ voxels (where a, b and c are positive integers), preferably by zero filling the phase image data values of the additional voxels. It should be appreciated that the masking steps and the step of increasing the matrix size can occur in any order. This results in a larger set of filtered phase image data values (denoted $\phi_{ZF\ M\ filtered}(r)$ in the figures). The final step in generating the modified k-space data simply involves Fourier Transforming $\phi_{ZF\ M\ filtered}(r)$ to obtain the modified k-space data (denoted $\phi_{ZF\ M\ filtered}(k)$ in the figures).

Figure 2:
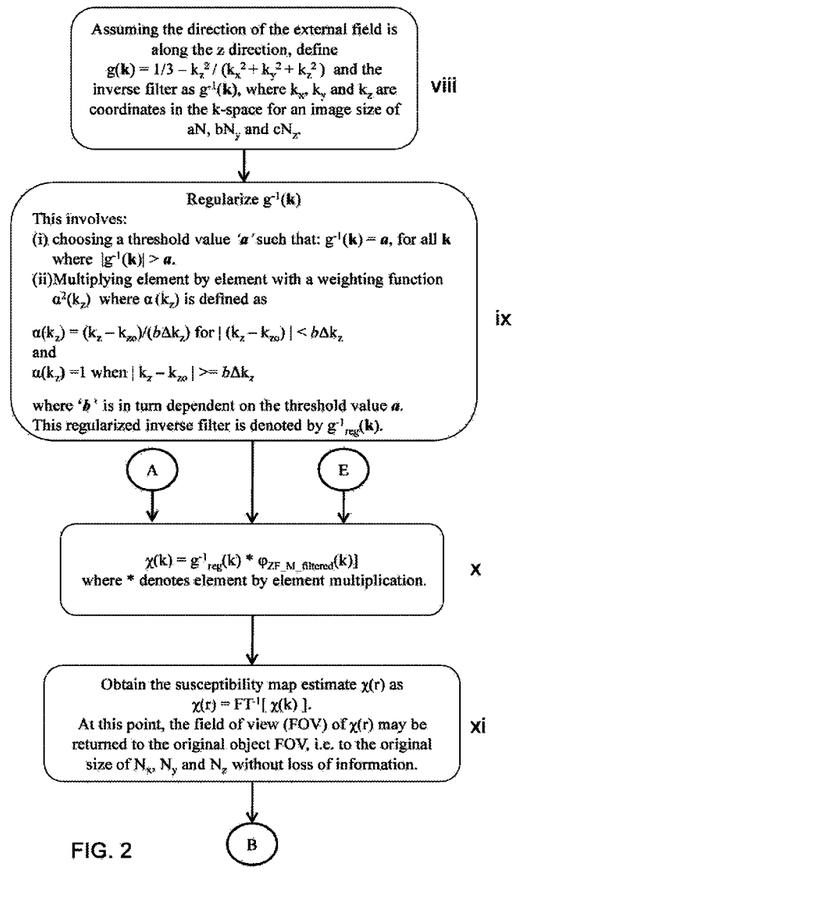

The regularized susceptibility mapping filter function is generated as shown in Steps viii and ix in FIG. 2. These two steps are performed in the order shown to yield the regularized susceptibility mapping filter function, which is the regularized inverse filter denoted by $g^{-1}_{reg}(k)$. It should be appreciated that this regularized inverse filter is generated from all the coordinates of the new, larger matrix size. In step ix, $k_{z0}$ denotes the set of $k_z$ coordinates at which $g(k_x, k_y, k_z)=0$.

Figure 3:
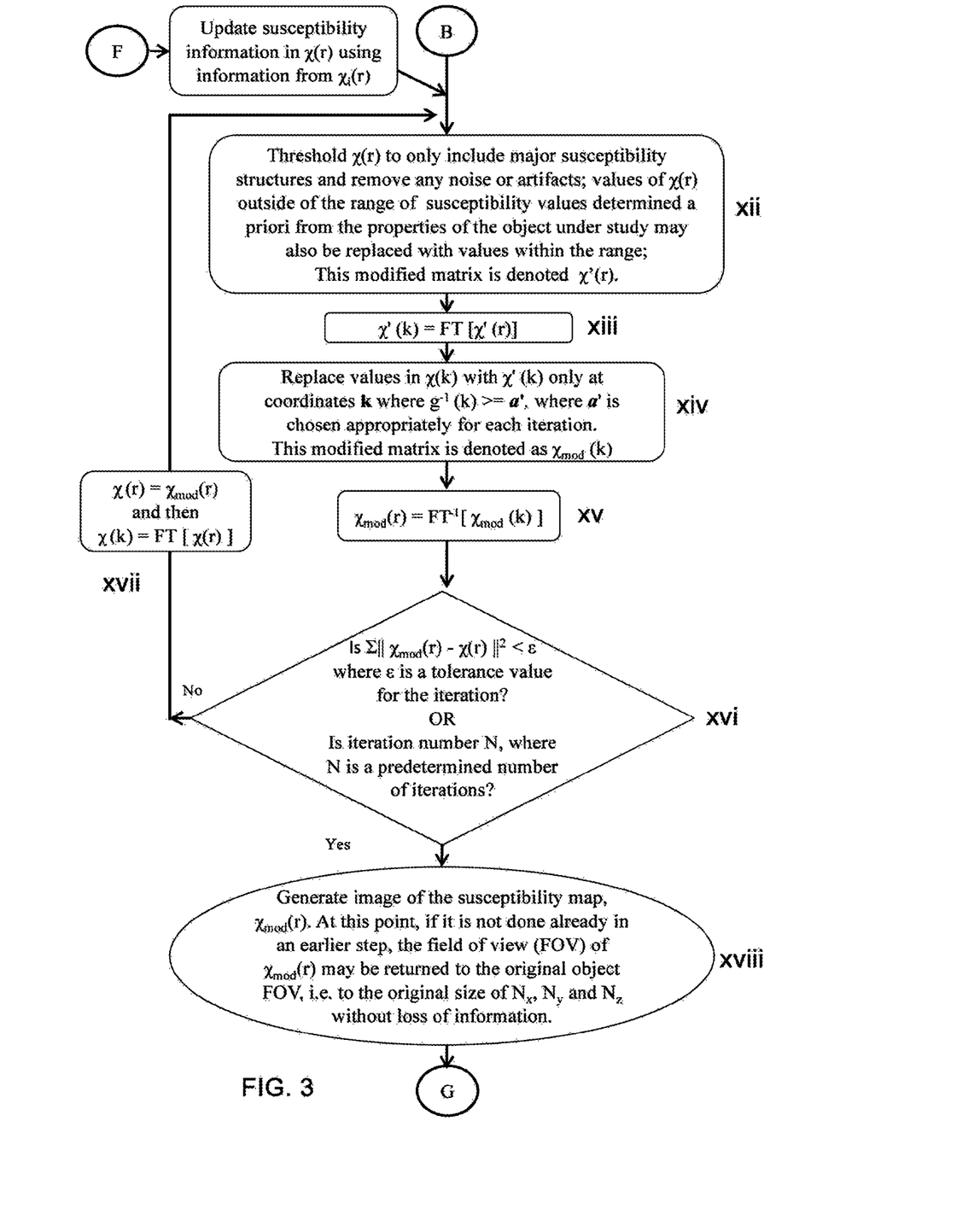
Figure 6:
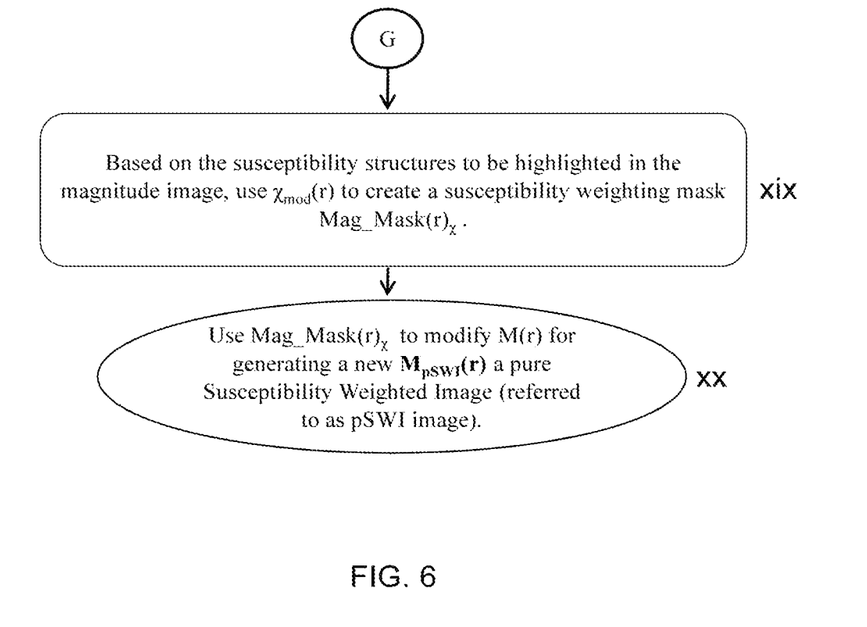

After having performed the steps above, a susceptibility map estimate is calculated by multiplying the regularized susceptibility mapping filter function and the modified k-space data (voxel by voxel, Step x) and thereafter inverse Fourier transforming the product (step xi). This yields an initial susceptibility map, denoted χ(r) in the figures. At this point, the object field of view (FOV) of χ(r) may, if desired, be returned to the original FOV, i.e., matrix size is same as $N_x$, $N_y$, and $N_z$, without loss of any information. To enhance the susceptibility map, the additional steps shown in FIG. 3 can be performed. As Step xii shows, a threshold can be applied to the susceptibility map in an effort to remove noise and artifacts, yielding a revised susceptibility map χ'(r). Furthermore, in certain conditions where the range of expected susceptibility values might be known from the properties of the system under investigation, Step xii may include replacing values with expected values of the susceptibility. Additionally, a substitution in k-space can further enhance the susceptibility map. Such a substitution can be performed according to steps xiii-xv. These steps involve Fourier transforming the revised susceptibility map in a manner obtaining a new k-space data set, χ'(k), replacing the values of χ(k) with those of χ'(k) at voxels where $g^{-1}(k) \geq a'$ (where a' can be equal to a of Step ix or some other value) to create a new modified k-space data set, $\chi_{mod}(k)$, and then inverse Fourier Transforming $\chi_{mod}(k)$ in a manner generating a modified susceptibility map $\chi_{mod}(r)$ estimate. As shown in FIG. 3, these steps can be repeated for a given number of iterations or until the susceptibility map changes by less than a predetermined amount. With each iteration, the set of $\chi_{mod}(r)$ values replace the previous set of χ(r) values and then χ(k) is set equal to the Fourier transform of χ(r), as is shown in step xvii. Finally, after having performed the steps described above, a digital image file of the object can be generated using the $\chi_{mod}(r)$ data values (by themselves or in combination with other image data). In any final step or intermediate step involving the production of chi(r), the noise outside the object of interest can be removed. Also, as mentioned in step xi, the object FOV can be returned to the original FOV such that the matrix size is once again $N_x$, $N_y$ and $N_z$, without loss of any information. Still further, as shown in FIG. 6, if desired, a susceptibility weighted magnitude mask can be generated from the $\chi_{mod}(r)$ data values and be used to generate a pure SWI image.

Optional Ideal Filter

In situations where the field caused by a structure having a well defined shape and unit susceptibility (or of a known susceptibility value) is known with great accuracy, then a k-space inverse filter, specific to that shape, can be defined by dividing the Fourier transform of the source geometry with the Fourier transform of the known field map:

$$G_{ideal}[k] = \frac{FT[Geometry_{object}(r)]}{FT[\Delta B(r)]}$$

Figure 4:
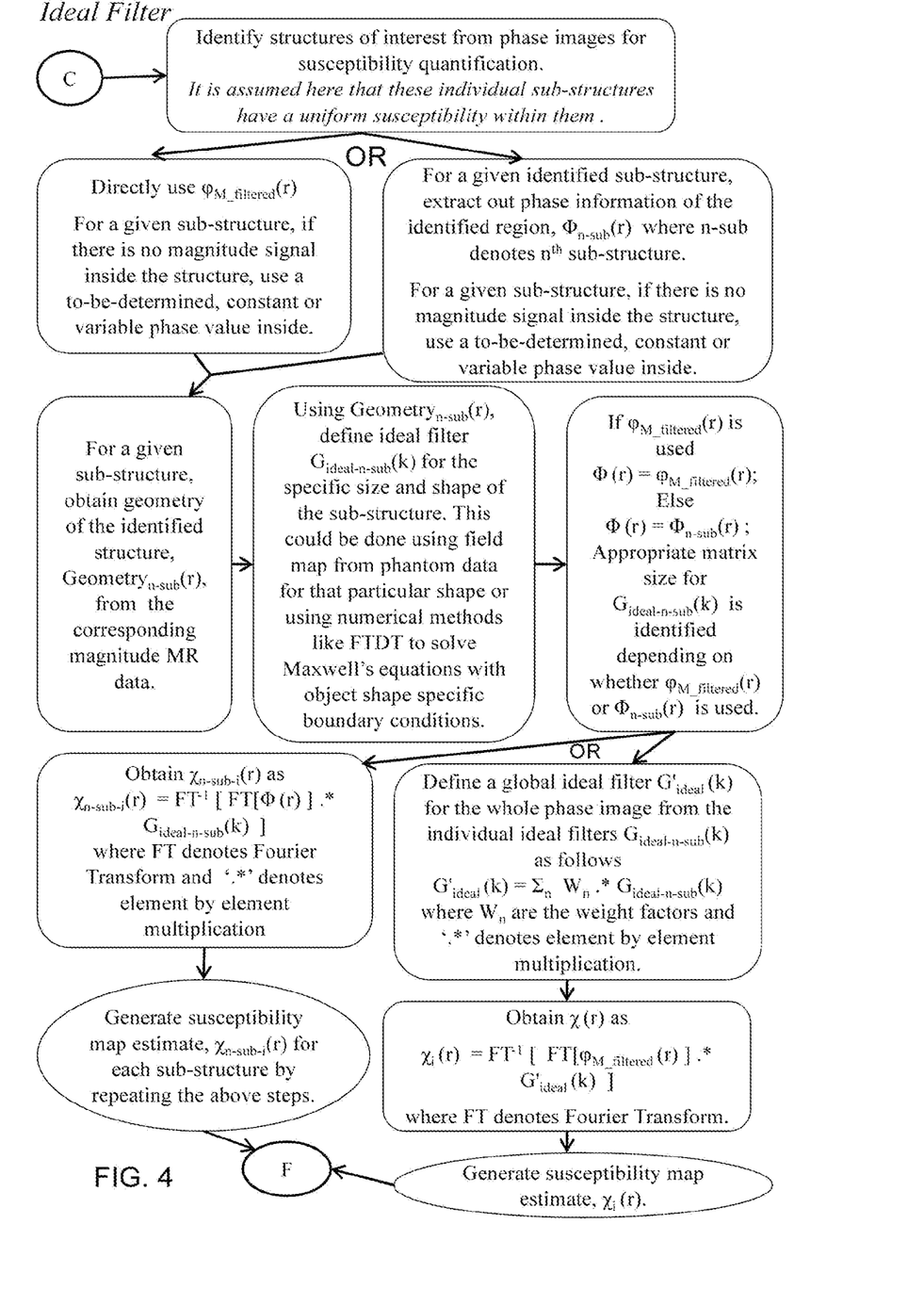
Figure 5:
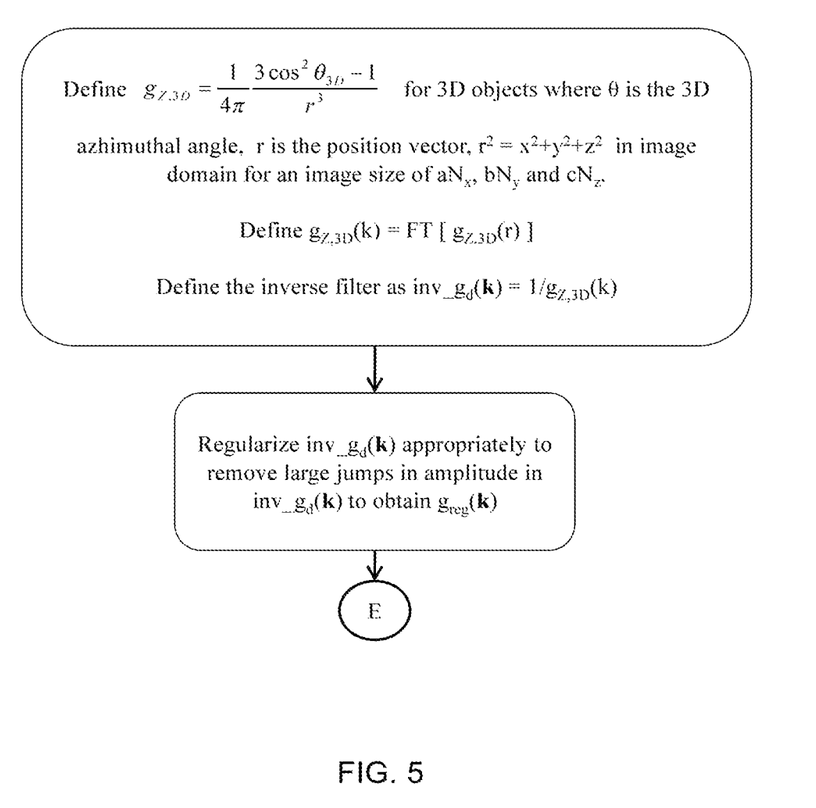

FIGS. 4-5 depict a flow chart of the implementations of an "ideal" filter that can be used in the present invention for such situations.

The primary assumption of the Born approximation, which is a pre-requisite for the linearity and superposition of fields when multiple objects are considered specifies that the induced magnetization in structures of different susceptibility is primarily due to the main external magnetic field $B_0$. For example, when two structures A and B of different susceptibilities are placed in an external magnetic field $B_0$ in close proximity, it is assumed that $\Delta B_A(r) \propto \chi_A \cdot B_0$ due to A does not influence the induced magnetization in structure B or vice versa, i.e. $\Delta B_B(r) \propto \chi_B \cdot B_0$.

The advantage of this ideal filter approach is that it can be used to account for the finite field of view and discrete shape boundary conditions of the object in its definition, and hence can be used to obtain a highly accurate chi-map with minimal artifacts. This filter contains all the possible higher order terms (specific to the shape) which are ignored in previous works. Furthermore, $G_{ideal}(k)$ is defined discretely, where FT is the discrete Fourier Transform as opposed to G(k) which is defined analytically. This has the advantage of better dealing with finite sampling issues. Still further, once such a filter defined for a specific object shape, it can be used to find the susceptibility from phase of one or more objects of the same shape and size.

Defining $G_{ideal}(k)$ for a given geometry can easily be done when the analytic expression for field perturbation due to that shape is known, like in the cases of standard symmetric geometries of spheres, cylinders or elipsoids. For an arbitrarily shaped object where an analytic expression for field perturbation is not known ΔB(r) data could be obtained by preparing phantoms of that shape and measuring the resulting field perturbation from the MR phase data. Another method to obtain/estimate ΔB(r) involves numerically solving Maxwell's equations with boundary conditions for the specific object shape, using one of the standard Finite-difference-Time-domain computational techniques. Finally, one can consider the known object to be the entire brain or other structure of interest within it with some guess of the susceptibilities coming from a priori knowledge or the current SWIM approach with some smoothing or like modifications.

Best results at defining $G_{ideal}(k)$ accurately are achieved when ΔB(r) of the object contain as little noise as possible. However, in cases where there is considerable noise present in ΔB(r), techniques like field fitting using an object-based model or modeling of the field in terms of polynomial functions can be used to remove noise from the ΔB(r) map of the object.

This Ideal Filter can be used in connection with susceptibility mapping discussed above to image a composite structure containing many sub-structures. For example, it can be applied to a brain where different sub-cortical structures, sinuses, gray matter, white matter, arteries, veins constitute the sub-structures/geometry. Given the magnitude image and the field map (i.e., phase images: unwrapped or high pass filtered) of the brain, assuming that ideal filters for each of the sub-structure shape is available, $G_{ideal}$ for each sub-structure or geometry can be applied individually to obtain the susceptibility value for that particular structure/geometry. Alternatively, a new $G'_{ideal}$ could be defined using the individual ideal filters for each sub structure. This can be a weighted summation of the individual filters (i.e., $G'_{ideal} = \Sigma_n W_n G_{ideal-n}$, where n denotes the index of the sub-structure).

Further optimization or regularization of $G'_{ideal}$ can, in some cases, improve results. For example, if the original $G_{ideal-HighRes}$ is defined for a larger object-size, i.e., with smaller voxel dimensions, then a corresponding $G_{ideal-LowRes-Estimate}$ can be defined from $G_{ideal-HighRes}$ for an object of same shape but a smaller size, i.e., at a lower resolution. However, in cases where $G_{ideal-LowRes-Estimate}$ is used, some regularization/filtering can reduce undesirable artifacts. Such artifacts arise because $G_{ideal-LowRes-Estimate}$ is only an estimate of the actual ideal filter for that object size. Using this approach is advantageous when trying to speed up the susceptibility mapping process by using an already defined $G_{ideal}$.

As various modifications could be made in the constructions and methods herein described and illustrated without departing from the scope of the invention, it is intended that all matter contained in the foregoing description or shown in the accompanying drawings shall be interpreted as illustrative rather than limiting. Thus, the breadth and scope of the present invention should not be limited by any of the above-described exemplary embodiments, but should be defined only in accordance with the following claims appended hereto and their equivalents.

It should also be understood that when introducing elements of the present invention in the claims or in the above description of the preferred embodiment of the invention, the terms "comprising", "applying", and "using," are intended to be open-ended and mean that there may be additional elements other than the listed elements. Moreover, use of identifiers such as first, second, and third should not be construed in a manner imposing time sequence between limitations unless such a time sequence is necessary to perform such limitations. Still further, the order in which the steps of any method claim that follows are presented should not be construed in a manner limiting the order in which such steps must be performed unless such order is necessary to perform such steps.

What is claimed:

1. A method of nuclear magnetic resonance imaging an object, the method comprising:
    (a) collecting k-space data from a gradient echo magnetic resonance scan of the object;
    (b) generating initial phase and initial magnitude values using the k-space data;
    (c) generating a revised set of phase values using at least some of the initial magnitude values and at least some of the initial phase values;
    (d) generating local change in magnetic field values using at least some of the revised set of phase values;
    (e) generating modified k-space data values (corresponding to phase), using at least some of the local change in magnetic field values;
    (f) generating regularized modified k-space data values by applying a regularized inverse filter to the modified k-space data values;
    (g) generating first susceptibility values using the regularized modified k-space data values;
    (h) generating second susceptibility values by applying a threshold to the first susceptibility values and/or replacing the susceptibility values by a set of pre-determined values;
    (i) generating third k-space data values using the first susceptibility values;
    (j) generating fourth k-space data values using the second susceptibility values;
    (k) merging the third k-space data values and the fourth k-space data values in a manner generating a fifth k-space data values;
    (k) generating third susceptibility values using the fifth k-space data values; and
    (l) generating a digital image file of the object using the third susceptibility values.

2. A method in accordance with claim 1 wherein steps (h) through (k) are repeated at least once, each time using the third susceptibility values in place of the first susceptibility values and overwriting prior values during each step of generating and merging values.

3. A method in accordance with claim 1 wherein the inverse in step (f) is based on an ideal inverse filter associated with a shape.

4. A method in accordance with claim 3 wherein the shape is that of at least part of the object.

5. A method in accordance with claim 3 wherein the ideal filter is used to generate the inverse filter for a series of like objects.

6. A method in accordance with claim 3 wherein the ideal filter is the geometry of a region of interest.

7. A method in accordance with claim 3 wherein the object is an entire human brain having a geometry, and the ideal filter is a filter based on the geometry of the entire human brain.

8. A method in accordance with claim 3 wherein the filter is generated from a digitized form of the analytic Green's function.

9. A method in accordance with claim 2 wherein the inverse in step (f) is based on an ideal inverse filter associated with a shape.

10. A method in accordance with claim 9 wherein the shape is that of at least part of the object.

11. A method in accordance with claim 9 wherein the ideal filter is used to generate the inverse filter for a series of like objects.

12. A method in accordance with claim 9 wherein the ideal filter is the geometry of a region of interest.

13. A method in accordance with claim 9 wherein the object is an entire human brain having a geometry, and the ideal filter is a filter based on the geometry of the entire human brain.

14. A method in accordance with claim 9 wherein the filter is generated from a digitized form of the analytic Green's function.

* * * * *

UNITED STATES PATENT AND TRADEMARK OFFICE
CERTIFICATE OF CORRECTION

PATENT NO. : 8,693,761 B2
APPLICATION NO. : 13/800118
DATED : April 8, 2014
INVENTOR(S) : E. Mark Haacke and Jaladhar Neelavalli

It is certified that error appears in the above-identified patent and that said Letters Patent is hereby corrected as shown below:

On the Title Page

Item (12) replace "Haake" with -- Haacke --

Item (72) Inventors replace "Haake" with -- Haacke --

Signed and Sealed this
Twenty-second Day of July, 2014

Michelle K. Lee
*Deputy Director of the United States Patent and Trademark Office*